United States Patent [19]

Yamaguchi et al.

[11] Patent Number: 4,994,400
[45] Date of Patent: Feb. 19, 1991

[54] METHOD OF FABRICATING A SEMICONDUCTOR DEVICE USING A TRI-LAYER STRUCTURE AND CONDUCTIVE SIDEWALLS

[75] Inventors: Tadanori Yamaguchi, Hillsboro, Oreg.; Yeou-Chong S. Yu, San Jose, Calif.; Carol A. Hacherl, Beaverton; Evan E. Patton, Portland, both of Oreg.

[73] Assignee: Tektronix, Inc., Beaverton, Oreg.

[21] Appl. No.: 302,519

[22] Filed: Jan. 27, 1989

[51] Int. Cl.$^5$ .................. H01L 21/00; H01L 21/02; H01L 21/265

[52] U.S. Cl. ........................ 437/31; 437/33; 437/147; 437/160; 437/161; 437/162; 357/34; 357/59; 148/DIG. 10; 148/DIG. 11

[58] Field of Search ............. 437/31, 33, 42, 47, 437/52, 147, 162, 189, 193, 195; 148/DIG. 10, DIG. 11; 357/34, 35, 49, 54, 59

[56] References Cited

U.S. PATENT DOCUMENTS

| | | | |
|---|---|---|---|
| 4,319,932 | 3/1982 | Jambotkar | 357/34 |
| 4,722,908 | 2/1988 | Burton | 437/191 |
| 4,847,670 | 7/1987 | Monkowski et al. | 357/34 |
| 4,916,083 | 4/1990 | Monkowski et al. | 437/31 |

FOREIGN PATENT DOCUMENTS 0145926 6/1985 European Pat. Off. ............ 437/47
0258447 11/1986 Japan .

OTHER PUBLICATIONS

Nakamura, T., Self-Aligned-Transistor with Sidewall Base Electrode, IEEE Trans. on Elect. Dev., vol. ED-29, No. 4, 1982, 596–600.
Konaka, S., A 30-ps Si Bipolar IC Using Super Self-Aligned Process Tech., IEEE Trans. on Elect. Dev., vol. ED-33, No. 4, Apr. 1986, pp. 526–531.
Yamaguchi, T., Process and Device Performance of a High-Speed Double Poly-Si Bipolar Tech. Using Bososenic-Poly Process with Coupling-Base Implant, IEEE Trans. on Elec. Dev., vol. 35, No. 8, Aug. 1988, pp. 1247–1256.
Sakai, T., Prospects of SST Technology for High Speed LSI, IEDM 85, 1985, IEEE, pp. 18–21.
Ghandhi, S., VLSI Fabrication Principles, pp. 421–422, 1983, Wiley & Sons.

Primary Examiner—Brian E. Hearn
Assistant Examiner—B. Everhart
Attorney, Agent, or Firm—John D. Winkelman; John Smith-Hill

[57] ABSTRACT

A semiconductor device is made from a body of semiconductor material having a layer of dielectric material and a first layer of conductive material over a main face of the body, the layers each having an opening therein through which an area of the main face of the body of semiconductor material is exposed. A second layer of conductive material is formed over the sides of the opening and the conductor material, whereby the second layer of conductive material is in conductive contact with the first layer of conductive material along the sides of the opening. Material of the second layer of conductive material is removed to a depth such that a portion of the main face of the body of semiconductor material is exposed but a sidewall of conductive material remains along a side of the opening and provides an electrically conductive connection between the first layer of conductive material and the body of the semiconductor material.

25 Claims, 6 Drawing Sheets

METHOD OF FABRICATING A SEMICONDUCTOR DEVICE USING A TRI-LAYER STRUCTURE AND CONDUCTIVE SIDEWALLS

BACKGROUND OF THE INVENTION

This invention relates to a method of fabricating a semiconductor device.

D. D. Tang, P. M. Solomon, T. H. Ning, R. D. Isaac and R. E. Burger, "1.25 µm Deep-Groove-Isolated Self-Aligned Bipolar Circuits," IEEE J. Solid-State Circuits, vol. SC-17, 925 (1982), discloses a method of fabricating an n-p-n transistor in which a first photomasking operation is used to define an area that is to receive a p-type implant, and will eventually contain the base of the transistor, and a second photomasking operation is used to pattern a layer of polysilicon, which forms a base contact and from which p-type dopant is diffused into the area that received the p-type implant, to form an extrinsic base. Therefore, this fabrication method is subject to the disadvantage that the area that receives the initial p-type implant must be sufficiently large to accommodate possible misalignment of the mask that is used to define the polysilicon base contact.

S. Konaka, Y. Yamamoto and T. Sakai, "A 30-ps Si Bipolar IC Using Super Self-Aligned Process Technology," IEEE Trans. Electron Devices, vol. ED-33, 526 (1986), describes a method of fabricating an n- p n transistor in which the emitter is self-aligned with respect to the base contact and the base contact is self-aligned with respect to the base, and therefore only one photomasking operation is required in order to form the transistor. In this method, a silicon nitride layer is formed over the region of the substrate in which the transistor is to be formed, and a layer of polysilicon is deposited over the silicon nitride layer. The polysilicon over the area corresponding to the emitter and base of the transistor is removed by a photomasking and etching operation, exposing the silicon nitride layer, and a surface layer of the polysilicon that remains is oxidized. The silicon nitride exposed by removal of polysilicon is removed by etching, and during the etching silicon nitride is removed from under the polysilicon, leaving a cavity. Polysilicon is deposited into the cavity providing a connection between the first deposit of polysilicon and the region that will be the base of the transistor. This method is subject to the disadvantage that it is difficult to control the side etching operation whereby the silicon nitride underneath the polysilicon is removed. Moreover, it is possible that voids will be formed when the polysilicon is deposited into the cavity formed by the side etching operation, so that reliability of connections between the first deposit of polysilicon and the base can be ensured.

T. Sakai et al, "Prospects of SST Technology for High Speed LSI", 1985 IEDM Tech. Dig., 18-21, describes a method that is similar to that described in S. Konaka et al.

SUMMARY OF THE INVENTION

A preferred embodiment of the invention in a first aspect is a method of making an intermediate structure in the manufacture of a semiconductor device utilizing a body of semiconductor material having a composite layer, comprising at least a layer of dielectric material and a first layer of conductive material, over a main surface of the body, the composite layer having an opening therein through which an area of the main surface of the body is exposed. A second layer of conductive material is formed over the sides of the opening and the exposed area of the main surface of the body, whereby the second layer of conductive material is in conductive contact with the first layer of conductive material along the sides of the opening. Material of the second layer of conductive material is removed to a predetermined depth such that a portion of said area of the main surface of the body is exposed but a sidewall of conductive material remains along a side of the opening and provides an electrically conductive connection between the first layer of conductive material and the body.

A preferred embodiment of the invention in a second aspect is a method of making an intermediate structure in the manufacture of a semiconductor device utilizing a body of semiconductor material having a composite layer over a main surface thereof. The composite layer comprises a first layer of dielectric material, a first layer of conductive material doped with an impurity of a first conductivity type, and a second layer of dielectric material, and has an opening therein through which an area of the main surface of the body is exposed. A second layer of conductive material is formed over the composite layer, the sides of the opening and the exposed area of the main surface of the body. Material of the second layer of conductive material is removed to a predetermined depth such that the composite layer of dielectric material is exposed and a portion of said area of the main surface of the body is exposed but a conductive sidewall remains along a side of the opening and provides an electrically conductive connection between the first layer of conductive material and the body. A dielectric sidewall is formed over the conductive sidewall while leaving a portion of the body exposed. A dopant of the first conductivity type is introduced into the body through said portion of the body, and a dopant of a second conductivity type is introduced into the body through said portion of the body.

A preferred embodiment of the present invention in a third aspect is a method of making an intermediate structure in the manufacture of a semiconductor device utilizing a body of semiconductor material having a composite layer over a main surface thereof, the composite layer comprising at least a first layer of conductive material and a layer of dielectric material with the layer of conductive material being between the body and the layer of dielectric material. The composite layer has an opening therein through which an area of the main surface of the body is exposed. A second layer of conductive material is formed over the composite layer, the sides of the opening and the exposed area of the main face of the body. Material of the second layer of conductive material is removed to a predetermined depth such that the composite layer is exposed and a portion of said area of the main face of the body is exposed, whereby a conductive sidewall is formed along a side of the opening.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1A:
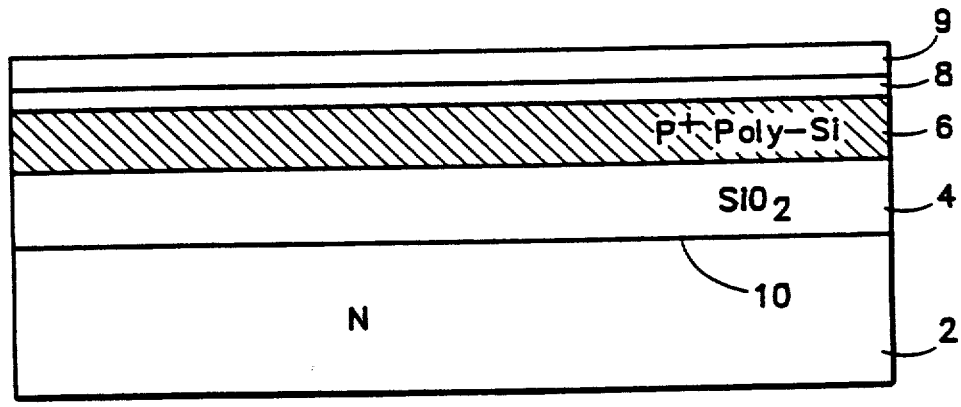
FIGS. 1(a)-1(i) illustrate various steps in fabrication of a bipolar transistor.
Figure 1B:
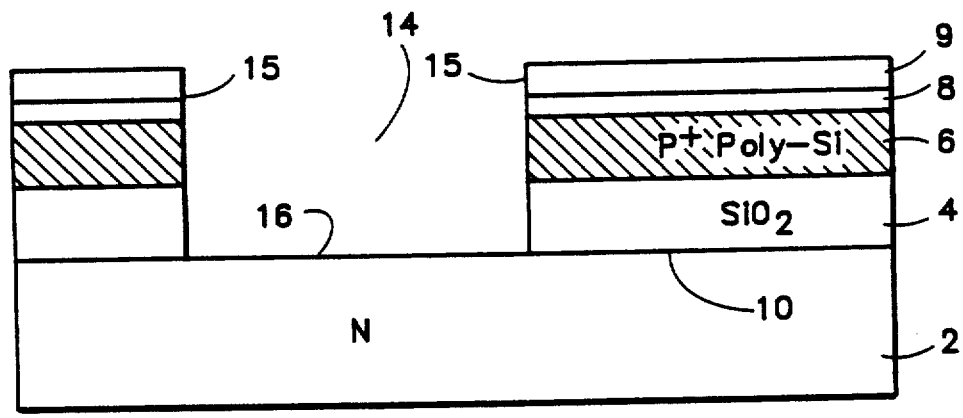

FIG. 1(a) illustrates a layer 2 of n-type silicon having layers 4, 6, 8 and 9 of silicon dioxide, polysilicon, silicon nitride and silicon dioxide over a main surface 10 of the layer 2. As will be described in further detail with reference to FIG. 2, the layer 2 is formed by epitaxial growth on a silicon substrate of p$^-$ conductivity (not shown in FIG. 1). The layer 4 is deposited on the layer 2 by chemical vapor deposition, but it may alternatively be formed by thermal oxidation of the silicon substrate. The layer 6 of polysilicon is doped with a p-type impurity to a concentration of about 1E20 cm$^{-3}$, so that it is of p$^+$ conductivity. The thicknesses of the layers 8 and 9 can be controlled within quite a small tolerance. Using a conventional photomasking and selective etching operation, an opening 14 is formed in the layers 4, 6, 8 and 9. The opening 14 has opposite sides 15 and exposes a portion 16 of the main surface 10 of the layer 2. FIG. 1(b).

Figure 1C:
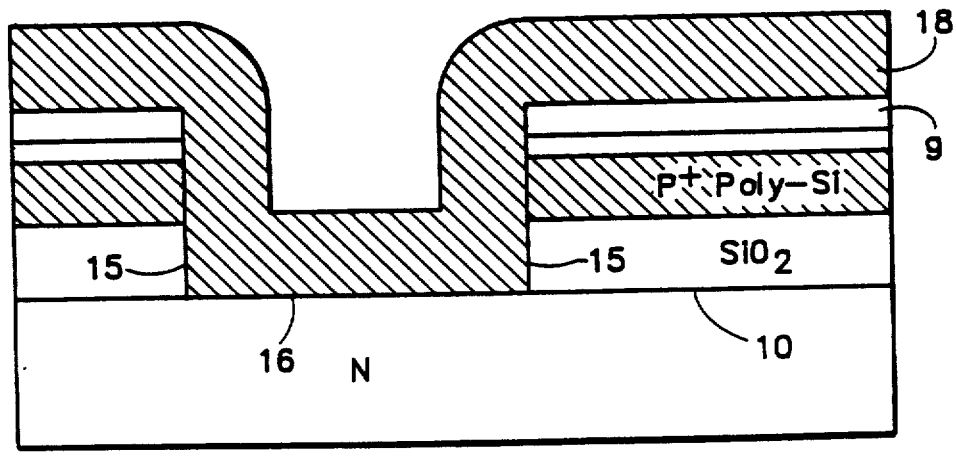
Figure 1D:
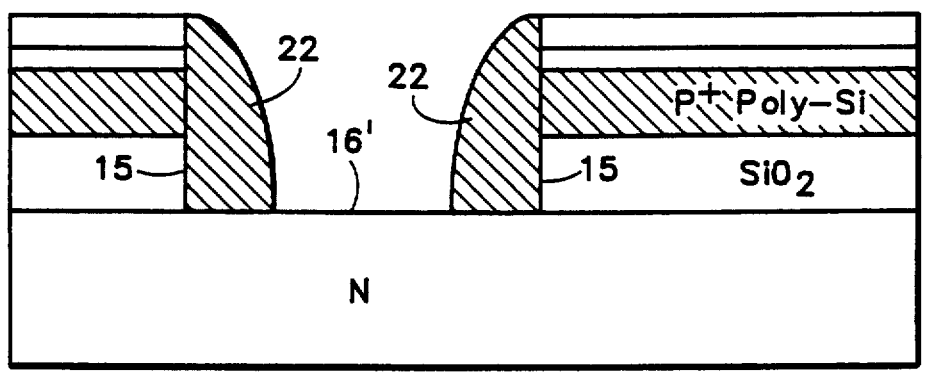
Figure 1E:
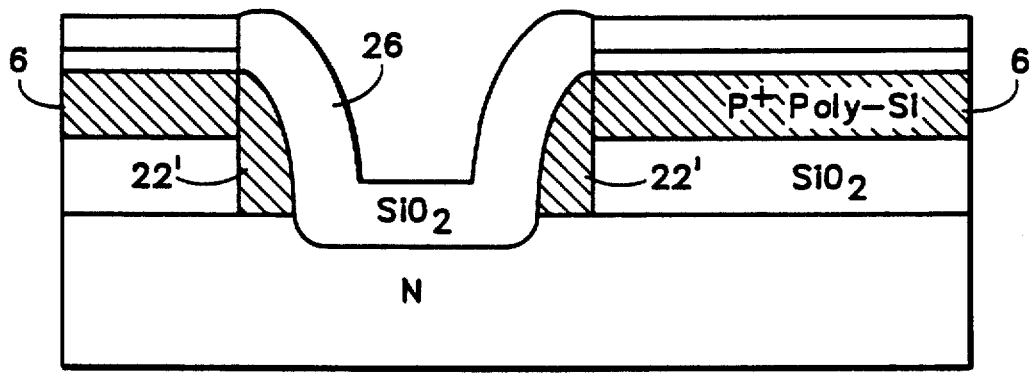

A layer 18 of polysilicon is formed over the structure shown in FIG. 1(b), as shown in FIG. 1(c). The thickness of the layer 18 is substantially uniform over the layer 9, the sides 15 of the opening 14 and the portion 16 of the main surface 10. The thickness of the layer 18 can be controlled within quite a small tolerance and is substantially less than half the distance between the sides 15 of the opening 14. The layer 18 is then etched in a direction perpendicular to the surface 10 to a depth equal to the thickness of the layer 18, so that the polysilicon over the upper surface of the layer 9 is removed and the polysilicon over parts of the surface portion 16 that are distant from the sides 15 of the opening 14 are removed, but spaced sidewalls 22 of polysilicon remain adjacent the sides of the opening. A part 16' of the surface portion 16 is exposed between the sidewalls. FIG. 1(d). Removal of the polysilicon to the required depth can be controlled since the thickness of the polysilicon layer is known and the rate at which the polysilicon is etched is known.

The sidewalls 22 provide electrical contact between the layer 6 and the layer 2. For a reason that will be explained with reference to FIG. 1(g), it is necessary to reduce the height of the sidewalls. This is accomplished by subjecting the structure shown in FIG. 1(d) to thermal oxidation. The polysilicon of the sidewalls 22 is partially oxidized, and therefore the sidewalls 22 are reduced in height, as indicated at 22' in FIG. 1(e). Ideally, the tops of the walls 22' are at the same height above the surface 10 as the top of the layer 6. During the thermal oxidation, the silicon of the layer 2 is partially oxidized also. A layer 26 of silicon dioxide is formed over the sidewalls 22' and over the surface of the layer 2 between the sidewalls 22'. Oxidation of the correct amount of polysilicon can readily be accomplished, since the thicknesses of the layers 8 and 9 are known and the rate of oxidation can be controlled. The thicknesses of the layers 8 and 9 should be such that the depth to which the substrate is oxidized between the sidewalls 22' is less than about 0.2 $\mu$m.

Figure 1F:
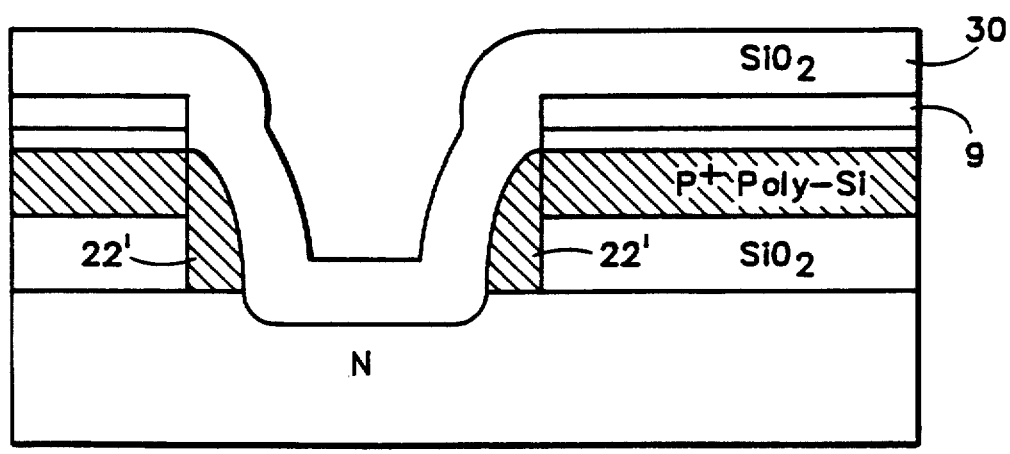
Figure 1G:
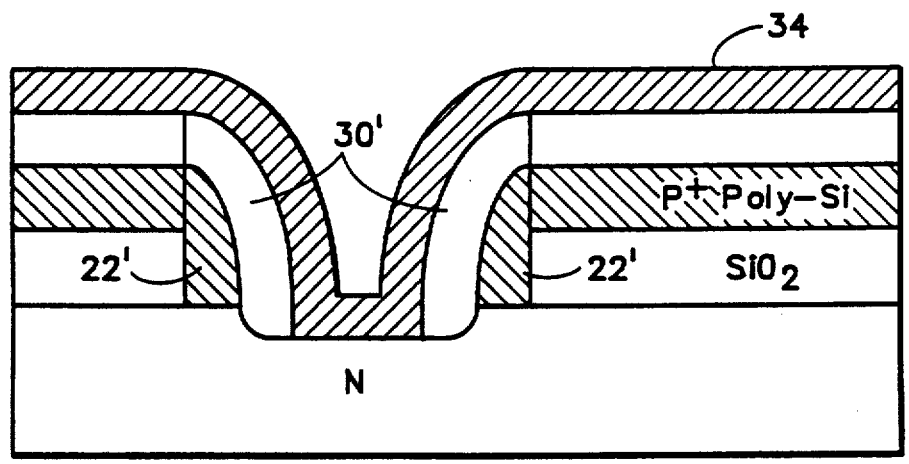
Figure 1H:
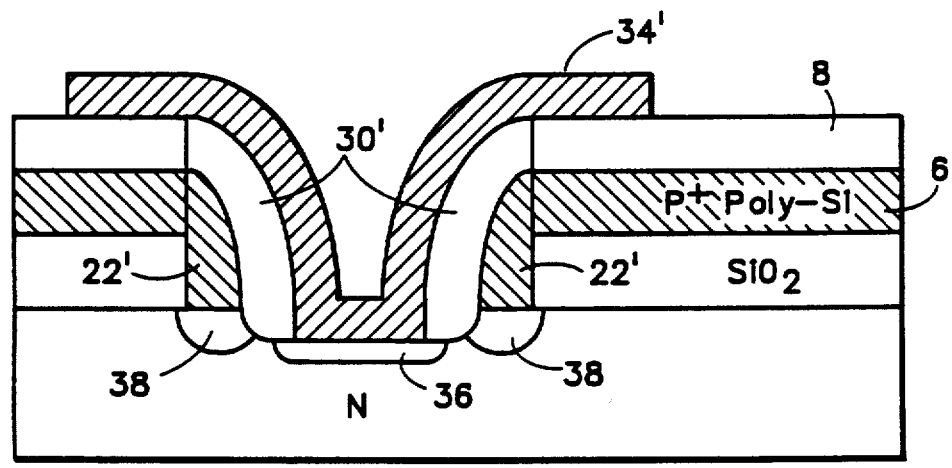
Figure 1I:
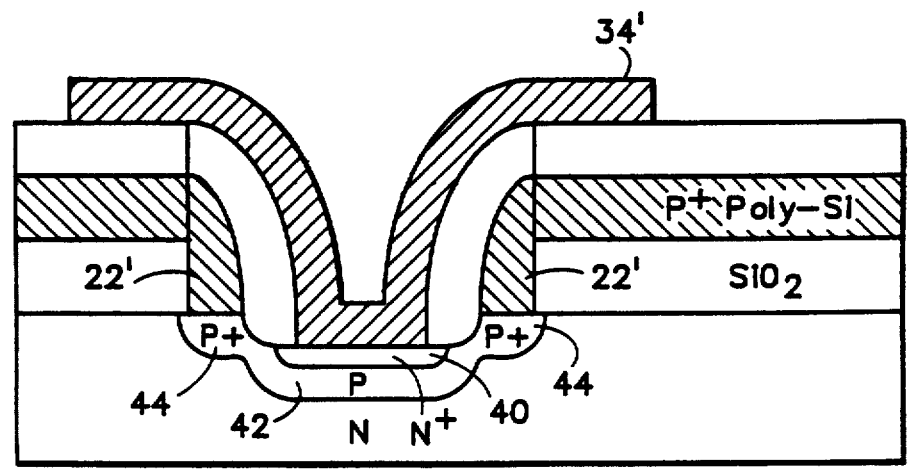

The silicon dioxide layer 26 is removed by etching and a layer 30 of silicon dioxide is deposited. The layer 30 is of substantially uniform thickness over the exposed portion of the main surface 10 of the layer 2, the sidewalls 22' and the layer 9. FIG. 1(f). Silicon dioxide of the layer 30 is then removed by etching to a depth such that the layer 9 is exposed and portions of the surface 10 that are remote from the sidewalls 22' are exposed, while the sidewalls 22' remain covered by oxide sidewalls 30'. An emitter polysilicon layer 34 is deposited over the layer 8, the oxide sidewalls 30' and the exposed portion of the main surface 10. The oxide sidewalls 30' provide electrical isolation between the polysilicon layer 34 and the polysilicon sidewalls 22'. FIG. 1(g). As shown in FIG. 1(h), the layer 34 is patterned to define an emitter contact 34', as will be further described with reference to FIG. 2, and a p-type dopant, such as boron, is implanted into the substrate through the emitter contact 34'. The oxide sidewalls 30' and the silicon nitride layer 8 are opaque to the dopant and therefore the implanted dopant only enters the layer 2 through the space defined between the oxide sidewalls 30'. A dose of 2E14 cm$^{-2}$ is employed. A diffusion operation then takes place, and the implanted p-type dopant diffuses at least part of the way beneath the oxide sidewalls 30' forming a p-type region 36. In addition, p-type dopant from the layer 6 diffuses into the polysilicon sidewalls 22' and into the region 38 of the substrate beneath the sidewalls 22'. An n-type implant having a dose of 1E16 cm$^{-2}$ is then performed through the emitter contact 34' and a further diffusion takes place, resulting in formation of an emitter 40 having a dopant concentration of about 1E20 cm$^{-3}$. Also, the contact 34' is heavily doped with n-type impurity. During this diffusion operation, the p-type dopant diffuses further into the layer 2. The p-type dopant that diffused from the layer 6 diffuses at least part way under the oxide sidewalls 30', and connects up with the p-type dopant that diffused from the p-type implant. Accordingly, an intrinsic base region 42 having a dopant concentration of about 2E18 cm$^{-3}$ is formed beneath the emitter 40 and an extrinsic base region 44 having a dopant concentration of about 3E19 cm$^{-3}$ is formed beneath the sidewalls 22'. It will therefore be seen that the base and emitter for an n-P-n transistor are formed using a single photomasking operation and without need for side etching or depositing polysilicon in circumstances such that there is a danger that voids will be formed. The emitter is self-aligned with respect to the base, and the polysilicon base contact is self-aligned with respect to the emitter.

Figure 2:
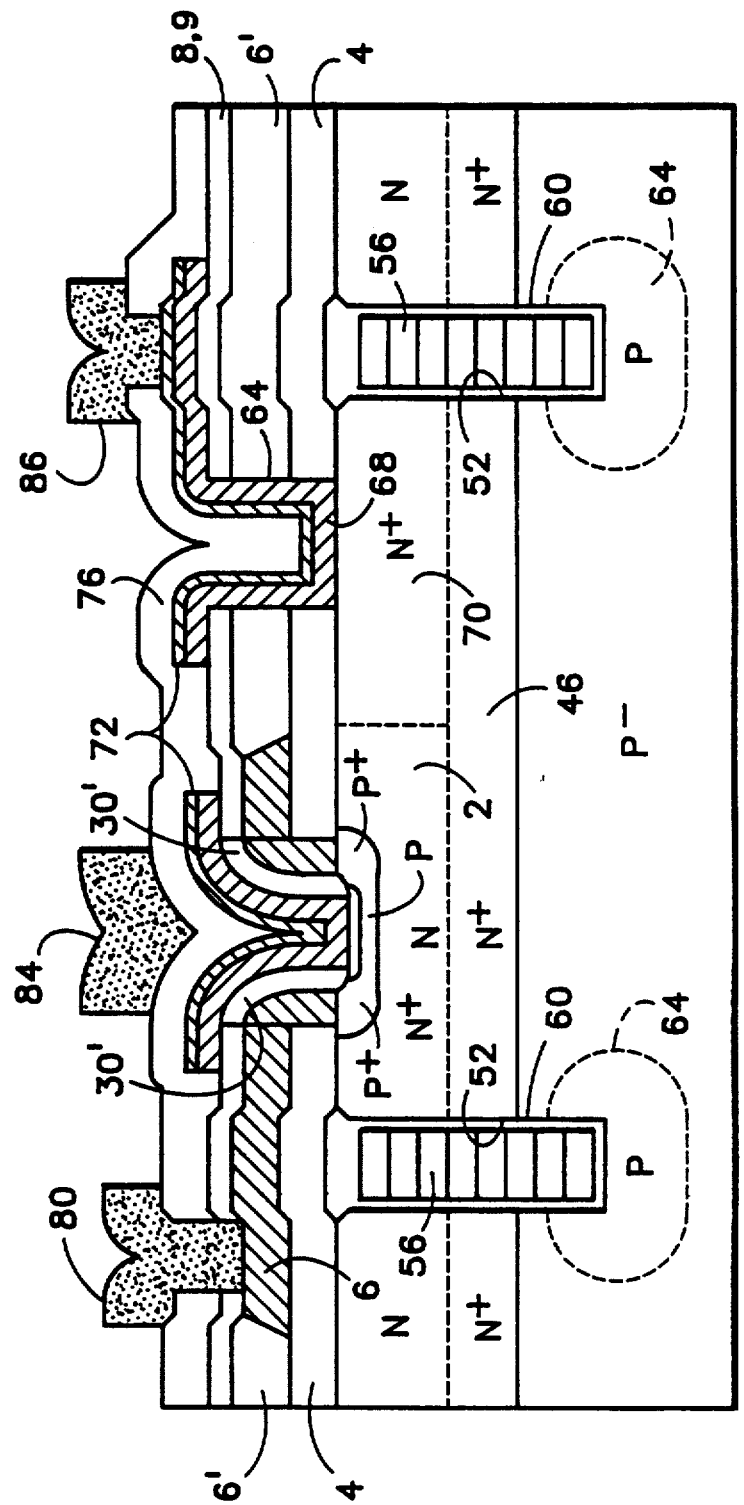
FIG. 2 illustrates the completed transistor.

FIG. 2 illustrates schematically a completed transistor. The FIG. 2 transistor is fabricated on a substrate of p$^-$ silicon. An n-type dopant, such as arsenic, is implanted into the substrate to form an n$^+$ region 46. The layer 2 is grown epitaxially over the region 46. An isolation trench 52 is formed in the epitaxial layer 2 and the substrate in order to isolate the transistor from other devices on the substrate and extends into the p$^-$ region of the substrate. The trench is filled with undoped polysilicon and the polysilicon is partially oxidized to form a body 56 of polysilicon surrounded by a layer 60 of silicon dioxide. Before the trench is filled, p-type material is implanted into the substrate by way of the trench, forming a channel stop zone 64 of p conductivity at the bottom of the trench. The method of forming the isolation trench is described in greater detail in co-pending patent application Ser. No. 07/201,491 filed June 2, 1988.

The layer 4 is deposited on the layer 2 by chemical vapor deposition after the trench 52 has been filled and the layers 6 and 8 are then successively deposited. The nitride layer 8 is patterned, so that the layer 8 remains only in the area where conductive material is required to form the base contact, and the polysilicon that is exposed by the patterning of the nitride layer 8 is thermally oxidized, to form an oxide layer 6'. The nitride layer must be thin in order to avoid cracking during the thermal oxidation operation. The oxide layer 9 is then deposited over both the remainder of the layer 8 and over the layer 6'.

After the oxide side walls 30' are formed, a hole 64 is cut in the layers 4, 6', 8 and 9 so that when the layer 34 is deposited, polysilicon enters this hole to contact the layer 2. The polysilicon layer 34 is patterned to define the emitter contact 34' and a separate collector contact 68, which extends into the hole 64. An n-type implant is performed through the collector contact 68 and a diffusion operation is carried out, forming an n+ region 70 in the epitaxial layer 2, extending to the n+ region of the substrate. The collector contact 68 is heavily doped with n-type impurity. The silicon dioxide layer 9 is exposed where the polysilicon of the layer 34 is removed when forming the contacts 34' and 68. Titanium is deposited over the contacts 34' and 68 and over the exposed portions of the layer 9. In an annealing operation, the titanium that is in contact with the contacts 34' and 68 combines with the polysilicon to form a layer 72 of titanium silicide, whereas the titanium that is deposited on the silicon dioxide layer 9 does not react and is removed by etching. A further layer 76 of silicon dioxide is deposited, and holes are cut in the layer 76 to receive base, emitter and collector metal 80, 84 and 86 respectively.

In the case of the method described with reference to FIG. 1, the procedure for reducing the height of the sidewalls 22 is subject to disadvantage in that it involves an oxidation operation during which the layer 2 also is oxidized. The oxidation operation causes mechanical stresses in the layer 2, and may result in crystal defects that affect performance of the transistor. Moreover, the oxidation process creates a bird's beak at the bottom of the sidewall 22', resulting in an increase in contact resistance between the sidewall 22' and the extrinsic base region 44. Oxidation of the layer 2 results in formation of a recess in the active device area. The effect of the recess is to increase the distance between the bottom of the sidewall 22' and the intrinsic base region 42, reducing the cut-off frequency of the transistor. Also, the thickness of the epitaxial layer 2 beneath the intrinsic base region 42 is reduced, and this reduces the collector-emitter breakdown voltage. The presence of the recess makes it difficult to ensure that the intrinsic base region and the extrinsic base region 44 will connect up properly in the second diffusion operation. Furthermore, in order to produce a smaller device, the thickness of the sidewall 22' must be reduced, but this cannot readily be accomplished by the method described with reference to FIG. 1.

FIG. 3 shows an alternative method for providing a polysilicon sidewall. FIG. 3(a) illustrates a layer 102 of silicon, formed in the same way as the layer 2 of FIG. 1(a), having layers 104, 106, 108 and 109, of silicon dioxide, polysilicon, silicon nitride and silicon dioxide respectively, formed on its main surface 110. A base window opening 114 is formed in the layers 104, 106, 108 and 109, similarly to FIG. 1, and a layer of undoped polysilicon is deposited over the layer 109, the sides 115 of the opening 114 and the exposed portion 116 of the main face 110, in similar manner to that described with reference to FIG. 1(c). The thickness of the polysilicon layer is substantially uniform over the layer 109, the sides 115 of the opening 114 and the exposed portion 116 of the main surface of the layer 2. The polysilicon layer is etched back by reactive ion etching in a direction perpendicular to the surface 110 to a depth equal to the thickness of the polysilicon layer, so that the layer 109 is exposed and the polysilicon over the parts of the surface portion 116 that are distant from the sides 115 of the opening 114 are removed, and spaced sidewalls 122 of polysilicon remain adjacent the sides of the opening.

Figure 3A:
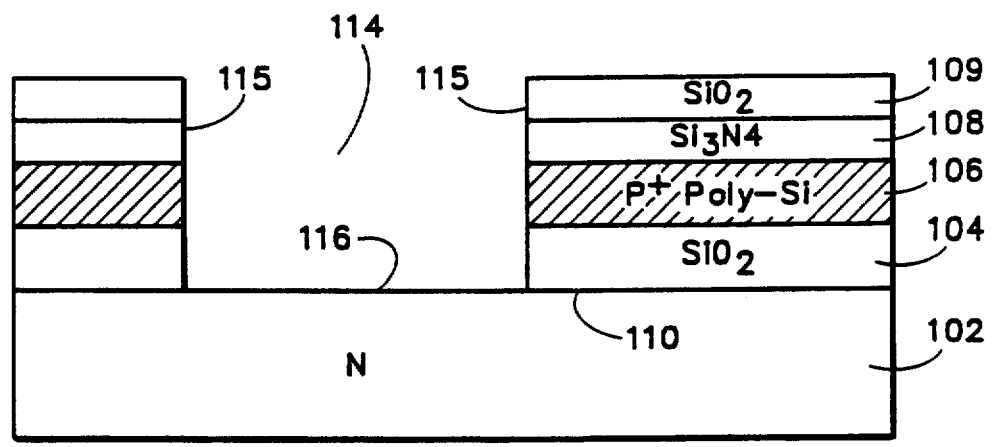
FIGS. 3(a)-3(e) illustrate an alternative to one of the procedures described with reference to FIG. 1.
Figure 3B:
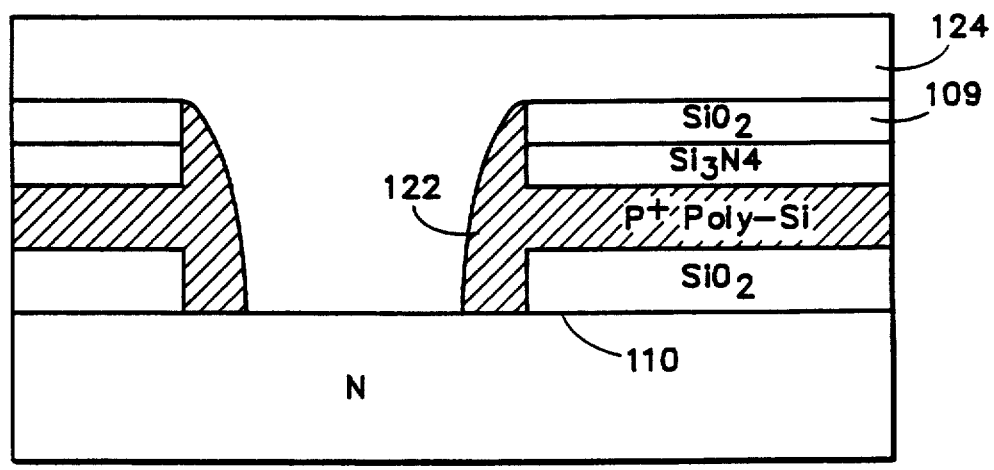
Figure 3C:
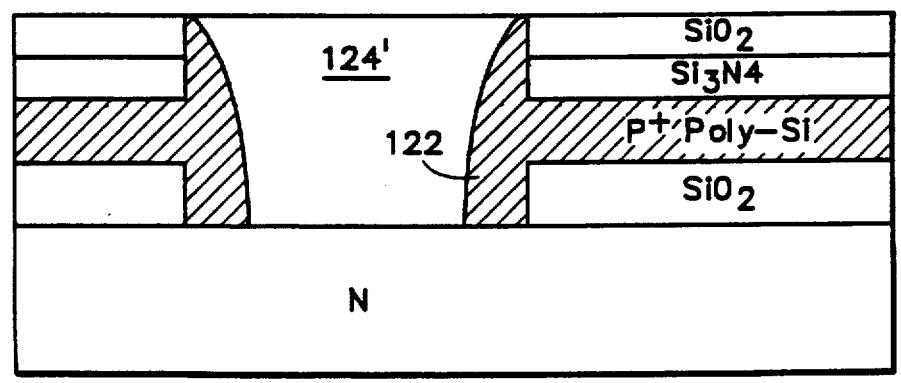
Figure 3D:
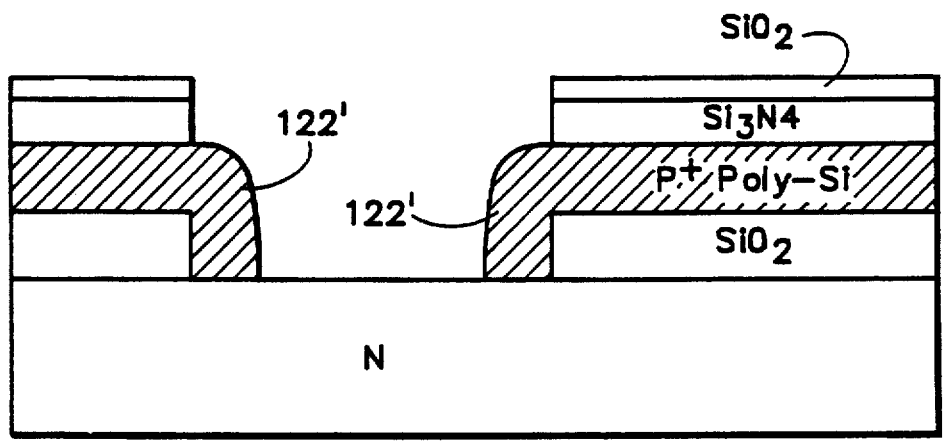
Figure 3E:
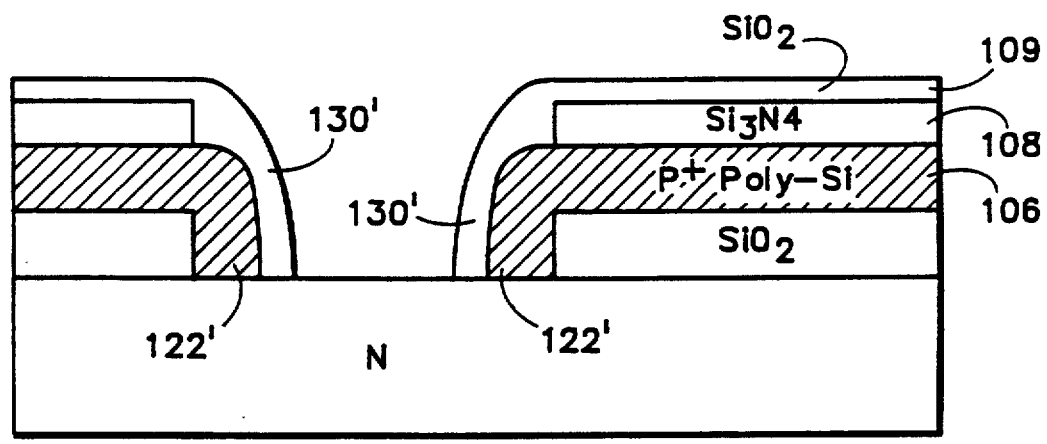

As shown in FIG. 3(b), photoresist 124 is then applied, filling the space between the sidewalls 122 and covering the layer 109. The substrate is spun, so that the free surface of the photoresist is at a uniform distance from the surface 110 of the layer 102. The photoresist is removed by etching until the oxide layer 109 is exposed. This operation leaves the sidewalls 122 and the photoresist 124' between them, as shown in FIG. 3(c). A reactive ion etching process is then carried out in order to reduce the height of the sidewalls 122, while the photoresist that remains between the sidewalls protects the active device area from the etchant. This reactive ion etching process removes the polysilicon and the photoresist material at the same rate, and continues until the tops of the reduced-height sidewalls 122' are aligned with the upper face of the polysilicon layer 106. FIG. 3(d). The remaining photoresist is then removed, and oxide sidewalls 130', shown in FIG. 3(e), are formed by depositing a layer of silicon dioxide and etching it back, as described with reference to FIG. 1(f) and FIG. 1(g). The remaining steps of the process are the same as those described with reference to FIGS. 1(g)–1(i) and FIG. 2.

During the reactive ion etching step described with reference to FIG. 3(d), silicon dioxide of the layer 109 is removed, but at a substantially lower rate than the photoresist. Silicon nitride also is attacked by the same etchant, at substantially the same rate as silicon dioxide. The thickness of the oxide layer 109 over the thin nitride layer 108 must be sufficient to ensure that the etching operation will not penetrate to the layer 106.

FIG. 3(d) shows that the problems associated with the method described with reference to FIG. 1 are avoided. The layer 102 is not oxidized, and the surface of the active device area remains planar and stress-free. The thickness of the polysilicon sidewalls 122' can be precisely controlled, so that reliable sidewall contacts can be formed. Also, the height of the sidewalls 122' can be precisely controlled, so that isolation of the sidewalls 122' from the emitter polysilicon layer is ensured. Since oxidation is not used to reduce the height of the side walls 122, there is no danger of a bird's beak being formed at the bottom of the sidewalls 122'.

It will be appreciated that the present invention is not restricted to the particular embodiments that have been described, and that variations may be made therein without departing from the scope of the invention as defined in the appended claims and equivalents thereof. For example, the polysilicon layer 18 may be doped with a p-type impurity in order to facilitate diffusion of p-type dopant into the substrate during the diffusion operations described with reference to FIG. 1(h) and FIG. 1(i). Also, the invention is not limited to the doses and concentrations that have been given, since these are provided only by way of example. Moreover, the invention is not restricted to the particular dopants that have been mentioned, or to the fabrication of an n-p-n transistor.

We claim:

1. A method of making an intermediate structure in the manufacture of a semiconductor device, comprising:
   (a) providing a body of semiconductor material having a composite layer over a main surface thereof, the composite layer comprising at least a first layer of dielectric material, a layer of conductive material, and a second layer of dielectric material with the layer of conductive material being between the first and second layers of dielectric material, the composite layer having an opening therein through which an area of the main surface of said body is exposed;
   (b) forming a conductive sidewall along one side of the opening, the conductive sidewall being spaced from an opposite side of the opening and being in conductive contact with both said body and said layer of conductive material;
   (c) forming a dielectric sidewall over the conductive sidewall while leaving a portion of said body exposed; and
   (d) introducing a dopant into the body through said portion of said body.

2. A method according to claim 1, wherein step (b) is performed by (i) forming a second layer of conductive material over the composite layer, the sides of the opening and said area of the main surface of said body, and (ii) removing material of the second layer of conductive material to a predetermined depth such that the composite layer is exposed and a portion of said area of the main surface of said body is exposed.

3. A method according to claim 2, wherein step (b) further comprises (iii) removing material of the second layer of conductive material to a depth such that the height of the conductive sidewall is substantially less than the thickness of the composite layer.

4. A method according to claim 3, wherein step (b) (iii) comprises introducing a resist material into the space between the conductive sidewall and said opposite side of the opening, and removing the material of the conductive sidewall by etching while the resist material protects the body of semiconductor material from the etchant.

5. A method according to claim 3, wherein the step (b) (iii) comprises reacting the material of the second layer of conductive material with another material to form a compound, and removing said compound by etching.

6. A method according to claim 1, comprising, between steps (c) and (d), forming a second layer of conductive material over the dielectric sidewall and the exposed portion of said body, and step (d) is performed by implanting said dopant into said body through the second layer of conductive material.

7. A method according to claim 1, wherein the body of semiconductor material provided in step (a) is doped with an impurity of a first conductivity type, and the dopant introduced in step (d) is of a second conductivity type, opposite the first conductivity type.

8. A method according to claim 7, further comprising:
   (e) introducing a dopant of said first conductivity type into said body through said portion of said body.

9. A method according to claim 7, wherein the layer of conductive material is doped with a selected impurity of the second conductivity type, the conductive sidewall being such that atoms of said selected impurity are able to diffuse through that sidewall, and the method further comprises heating the layer of conductive material, the conductive sidewall and said body so that atoms of the selected impurity diffuse from the layer of conductive material into said body by way of the conductive sidewall and form a zone of the second conductivity type in said body.

10. A method according to claim 9, further comprising heating said body after step (d), so that atoms of said dopant diffuse within said body.

11. A method of making an intermediate structure in the manufacture of a semiconductor device, comprising:
   (a) providing a body of semiconductor material having a composite layer over a main surface thereof, the composite layer comprising at least a first layer of dielectric material, a first layer of conductive material doped with an impurity of a first conductivity type, and a second layer of dielectric material with the layer of conductive material between the first and second layers of dielectric material, the composite layer having an opening therein through which an area of the main surface of said body is exposed;
   (b) forming a second layer of conductive material over the composite layer, the sides of the opening and the exposed area of the main surface of said body;
   (c) removing material of the second layer of conductive material to a predetermined depth such that the composite layer is exposed and a portion of said area of the main surface of said body is exposed but a conductive sidewall remains along a side of the opening, the conductive sidewall being spaced from an opposite side of the opening and providing an electrically conductive connection between the first layer of conductive material and said body;
   (d) forming a dielectric sidewall over the conductive sidewall while leaving a portion of said body exposed;
   (e) introducing a dopant of the first conductivity type into said body through said portion of said body; and
   (f) introducing a dopant of a second conductivity type, opposite the first conductivity type, into said body through said portion of said body.

12. A method according to claim 11, wherein step (c) further comprises removing material of the second layer of conductive material to a depth such that the height of the conductive sidewall is substantially less than the thickness of the composite layer.

13. A method according to claim 12, comprising introducing a resist material into the space between the conductive sidewall and said opposite side of the opening, and removing the material of the conductive sidewall by etching while the resist material protects the body of semiconductor material from the etchant.

14. A method according to claim 12, comprising reacting the material of the second layer of conductive material with another material to form a compound, and removing said compound by etching.

15. A method according to claim 11, wherein steps (e) and (f) are performed by implantation, and the method further comprises, between steps (e) and (f), diffusing atoms of the dopant introduced in step (e) within said body, and, after step (f), diffusing atoms of the dopant introduced in step (f) within said body.

16. A method of making an intermediate structure in the manufacture of a semiconductor device, comprising:
   (a) providing a body of semiconductor or material having a composite layer over a main surface thereof, the composite layer comprising at least a first layer of conductive material and a layer of dielectric material with the first layer of conductive material being between said body and said layer of dielectric material, the composite layer having an opening therein through which an area of the main surface of said body is exposed;
   (b) forming a second layer of conductive material over the composite layer, the sides of the opening and said area of the main surface of said body,
   (c) removing material of the second layer of conductive material to a predetermined depth such that the composite layer is exposed and a portion of said area of the main surface of said body is exposed, whereby a conductive sidewall is formed along a side of the opening,
   (d) introducing a resist material into the space between the conductive sidewalls, and
   (e) removing the material of the sidewalls to a selected depth by etching, the resist material protecting the body of semiconductor material from the etchant.

17. A method according to claim 16, wherein the resist material is applied over the layer of dielectric material and is planarized so that it has a free surface that is spaced at a uniform distance from the main surface of said body.

18. A method according to claim 4, wherein the resist material is a photoresist and the method comprises applying the photoresist over the second layer of dielectric material and planarizing the photoresist so that it has a free surface that is spaced at a uniform distance from the main surface of said body.

19. A method according to claim 7, wherein the layer of conductive material is uniformly doped with a selected impurity of the second conductivity type, and step (b) comprises forming a conductive sidewall along said opposite side of the opening, spaced from the conductive sidewall along said one side of the opening.

20. A method according to claim 19, further comprising:
   (e) introducing a dopant of said first conductivity type into said body through said portion of the body.

21. A method according to claim 19, wherein the conductive sidewalls are such that atoms of said selected impurity are able to diffuse through those sidewalls, and the method further comprises heating the layer of conductive material, the conductive sidewalls and said body so that atoms of the selected impurity diffuse from the layer of conductive material into said body by way of the conductive sidewall and form first and second zones of the second conductivity type in said body, beneath the conductive sidewalls respectively.

22. A method according to claim 21, further comprising heating said body after step (d), so that atoms of said dopant diffuse within said body and form a third zone of the second conductivity type, said third zone and said first and second zones merging to form a single zone of the second conductivity type.

23. A method according to claim 11, wherein the first layer of conductive material is uniformly doped with a selected impurity of the first conductivity type, and step (d) comprises forming a conductive sidewall along said opposite side of the opening, spaced from the conductive sidewall along said one side of the opening.

24. A method according to claim 23, wherein the conductive sidewalls are such that atoms of said selected impurity are able to diffuse through those sidewalls, and the method further comprises heating the first layer of conductive material, the conductive sidewalls and said body so that atoms of the selected impurity diffuse from the layer of conductive material into said body by way of the conductive sidewall and form first and second zones of the first conductivity type in said body, beneath the conductive sidewalls respectively.

25. A method according to claim 24, further comprising heating said body after step (e), so that atoms of the dopant introduced in step (d) diffuse within said body and form a third zone of the first conductivity type, said third zone and said first and second zones merging to form a single zone of the first conductivity type.

* * * * *